(12) United States Patent
He et al.

(10) Patent No.: US 6,568,464 B1
(45) Date of Patent: May 27, 2003

(54) HEAT SINK CLIP ASSEMBLY

(75) Inventors: Li He, Shenzhen (CN); Tsung-Lung Lee, Tu-Chen (TW); Cheng-Tien Lai, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/099,571

(22) Filed: Mar. 14, 2002

(30) Foreign Application Priority Data

Dec. 21, 2001 (TW) ...................... 90222542 U

(51) Int. Cl.[7] .............................. F28F 7/00; H01L 23/34
(52) U.S. Cl. ...................... 165/80.3; 165/76; 165/80.1; 257/718; 257/719
(58) Field of Search .................. 165/80.3, 80.1, 165/76; 257/718, 719; 361/697, 703, 704

(56) References Cited

U.S. PATENT DOCUMENTS

| | | | | |
|---|---|---|---|---|
| 5,699,229 A | * | 12/1997 | Brownell | ................ 361/687 |
| 5,818,695 A | * | 10/1998 | Olson | ................ 361/719 |
| 5,870,288 A | * | 2/1999 | Chen | ................ 361/704 |
| 5,960,862 A | * | 10/1999 | Hu | ................ 165/80.3 |
| 6,055,159 A | * | 4/2000 | Sun | ................ 257/718 |
| 6,424,530 B1 | * | 7/2002 | Lee et al. | ................ 165/80.3 |
| 6,434,004 B1 | * | 8/2002 | Matteson | ................ 165/80.3 |
| 6,496,371 B2 | * | 12/2002 | Winkel et al. | ................ 257/719 |

* cited by examiner

Primary Examiner—Henry Bennett
Assistant Examiner—Tho V Duong
(74) Attorney, Agent, or Firm—Wei Te Chung

(57) ABSTRACT

A heat sink clip assembly for attaching a heat sink (10) to a CPU (60) mounted to a motherboard (50). The heat sink clip assembly includes two bolts (40), and two wire clips (30). Two screw holes (16) are defined in opposite side faces of the heat sink. Each bolt includes a pole (44), a head (42), and a threaded end (46). Each clip has a coiled portion (32), and two spring arms (34) extending from opposite ends of the coiled portion. The coiled portions of the clips are respectively placed over the poles of the bolts. The threaded ends of the bolts are screwed into the screw holes; thus, each clip is retained between the head of a corresponding bolt and a side face of the heat sink. A hook (36) is formed on each spring arm, for engaging in a corresponding through hole (52) of the motherboard.

10 Claims, 3 Drawing Sheets

HEAT SINK CLIP ASSEMBLY

BACKGROUND OF THE INVENTION

1. Field of the Invention

The present invention relates to securing of heat sinks to electronic devices, and particularly to clips of heat sink clip assemblies that have coiled structures which can be configured to provide suitable pressing force acting on a heat sink.

2. Related Art

Advances in microelectronics technology have resulted in electronic devices which process signals and data at unprecedented high speeds. During operation of many contemporary electronic devices such as central processing units (CPUs), large amounts of heat are produced. The heat must be efficiently removed, to prevent the system from becoming unstable or being damaged. Heat sink assemblies are frequently used to dissipate heat from these electronic devices.

A clip is often used to attach a heat sink to an electronic device. An example of a conventional heat sink clip assembly is disclosed in Taiwan Patent Application No. 86212202. In such assembly, a pressing wire attaches a heat sink to an electronic device. A pair of coiled portions is formed at opposite ends of the pressing wire. A fastener extends across a corresponding coiled portion and engages with a through hole of a motherboard, thereby attaching the heat sink to the electronic device. However, the heat sink clip assembly cannot keep the heat sink in position efficiently. The pressing wire occupies space between fins of the heat sink, and limits a density of fins of the heat sink. This reduces an effective heat-dissipating area of the heat sink. Further examples of conventional heat sink clip assemblies are found in U.S. Pat. Nos. 5,684,676 and 5,730,210.

An improved heat sink clip assembly which overcomes the above-mentioned problems is desired.

BRIEF SUMMARY OF THE INVENTION

Accordingly, an object of the present invention is to provide a heat sink clip assembly having coiled structures which can readily and securely attach a heat sink to an electronic device.

Another object of the present invention is to provide a heat sink clip assembly which has a simple structure and reduces costs.

To achieve the above-mentioned objects, a heat sink clip assembly of the present invention is used to attach a heat sink to a CPU which is mounted to a motherboard. The heat sink clip assembly comprises a pair bolts, and two wire clips. Two screw holes are defined in opposite side faces of the heat sink. Each bolt comprises a pole, a head, and a threaded end. Each wire clip has a coiled portion, and two spring arms respectively extending from opposite ends of the coiled portion. The coiled portions of the wire clips are respectively placed over the poles of the bolts. The threaded ends of the bolts are screwed into the screw holes of the heat sink; thus, each wire clip is retained between the head of a corresponding bolt and a side face of the heat sink. A hook is formed at a distal end of each spring arm, for engaging in a corresponding through hole of the motherboard.

Other objects, advantages and novel features of the present invention will be drawn from the following detailed description of a preferred embodiment of the present invention together with the attached drawings, in which:

DESCRIPTION OF THE PREFERRED EMBODIMENT

Figure 1:
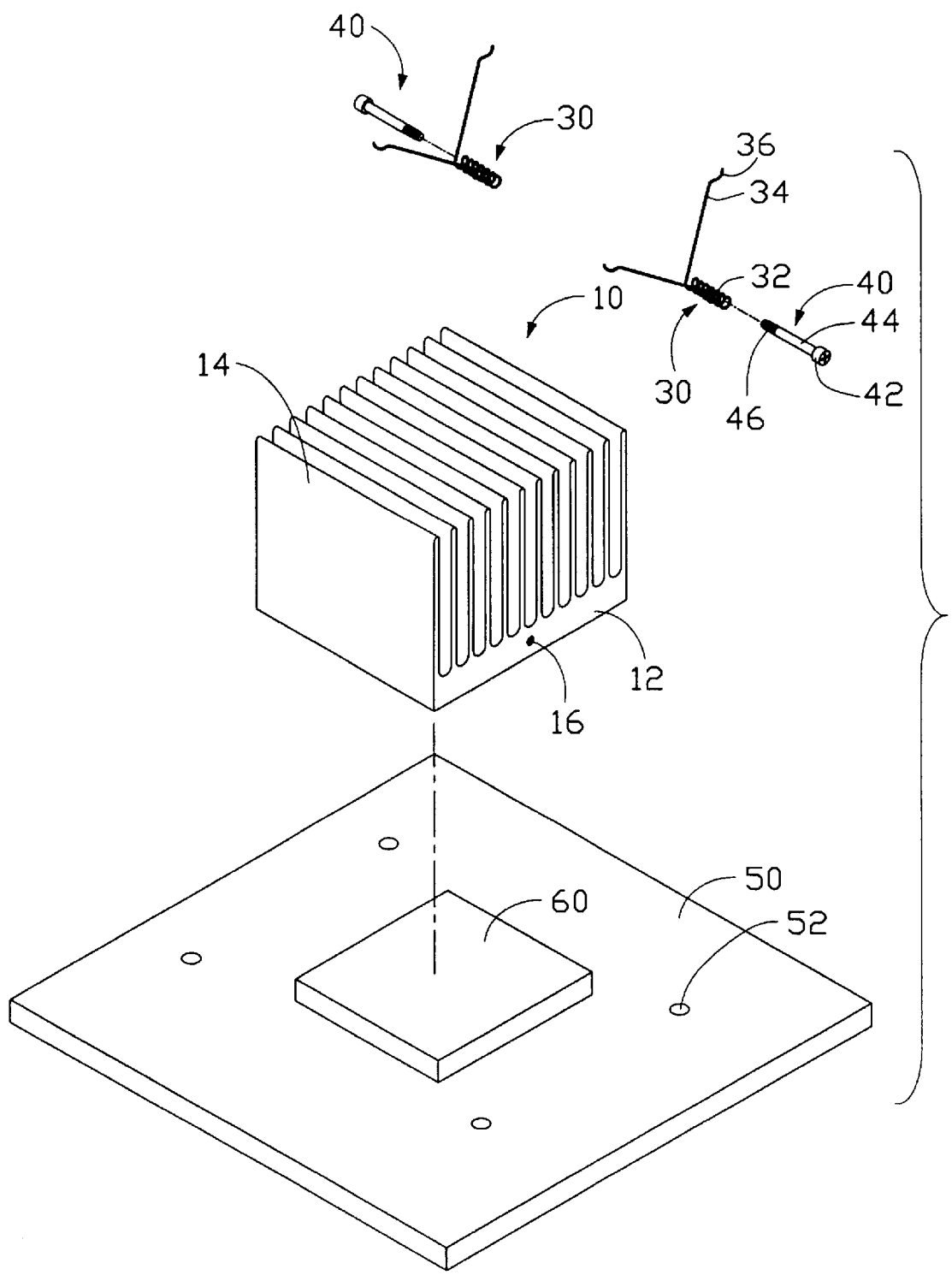
FIG. 1 is an exploded perspective view of a heat sink clip assembly in accordance with the present invention, together with a heat sink, a CPU and a motherboard.

Referring to FIG. 1, a heat sink clip assembly in accordance with the present invention comprises a pair of bolts 40, and a pair of elastically deformable wire clips 30. The heat sink clip assembly is used to attach a heat sink 10 to a CPU 60 which is mounted to a motherboard 50. The heat sink 10 has a base 12, and a plurality of fins 14 extending upwardly from the base 12. A pair of screw holes 16 is respectively defined in middle portions of opposite side faces of the base 12. Four through holes 52 are defined in the motherboard 50 around the CPU 60.

Each wire clip 30 is integrally made from a single piece of spring steel wire. The wire clip 30 comprises a coiled portion 32, and two spring arms 34 respectively extending from opposite ends of the coiled portion 32. Each spring arm 34 extends perpendicularly relative to a central axis of the coiled portion 32. A distal end of each spring arm 34 is further bent to form a hook 36. Each bolt 40 has a pole 44, a head 42, and a threaded end 46. The head 42 has a diameter larger than that of the pole 44.

Figure 2:
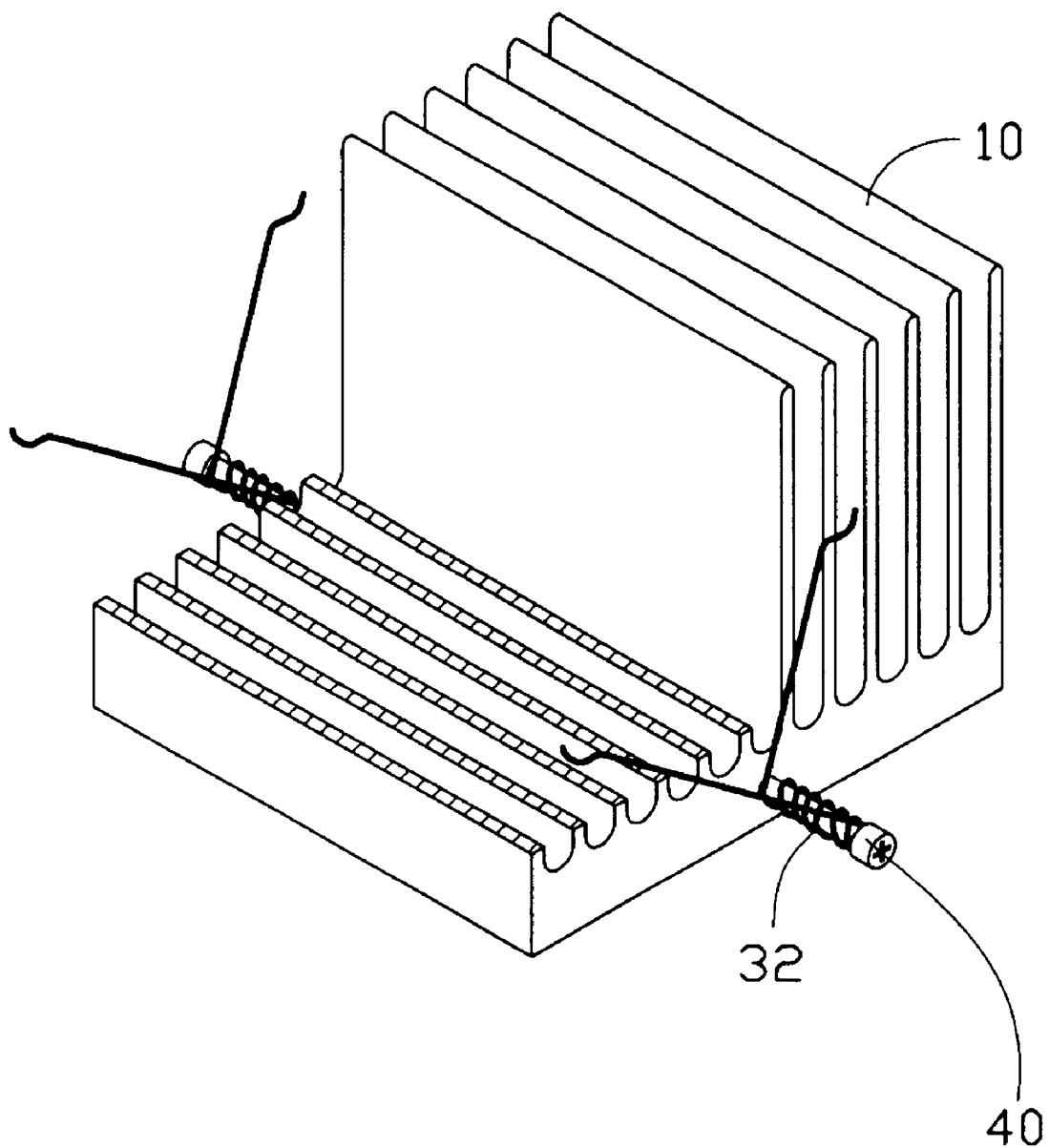
FIG. 2 is a cut-away perspective view of the heat sink clip assembly of FIG. 1 attached to the heat sink.

Referring to FIG. 2, in assembly, the coiled portions 32 of the wire clips 30 are respectively placed over the poles 44 of the bolts 40. The threaded ends 46 of the bolts 40 are respectively screwed into the screw holes 16 of the heat sink 10. Each wire clip 30 is retained around the pole 44 between the head 42 and a corresponding side face of the base 12 of the heat sink 10.

Figure 3:
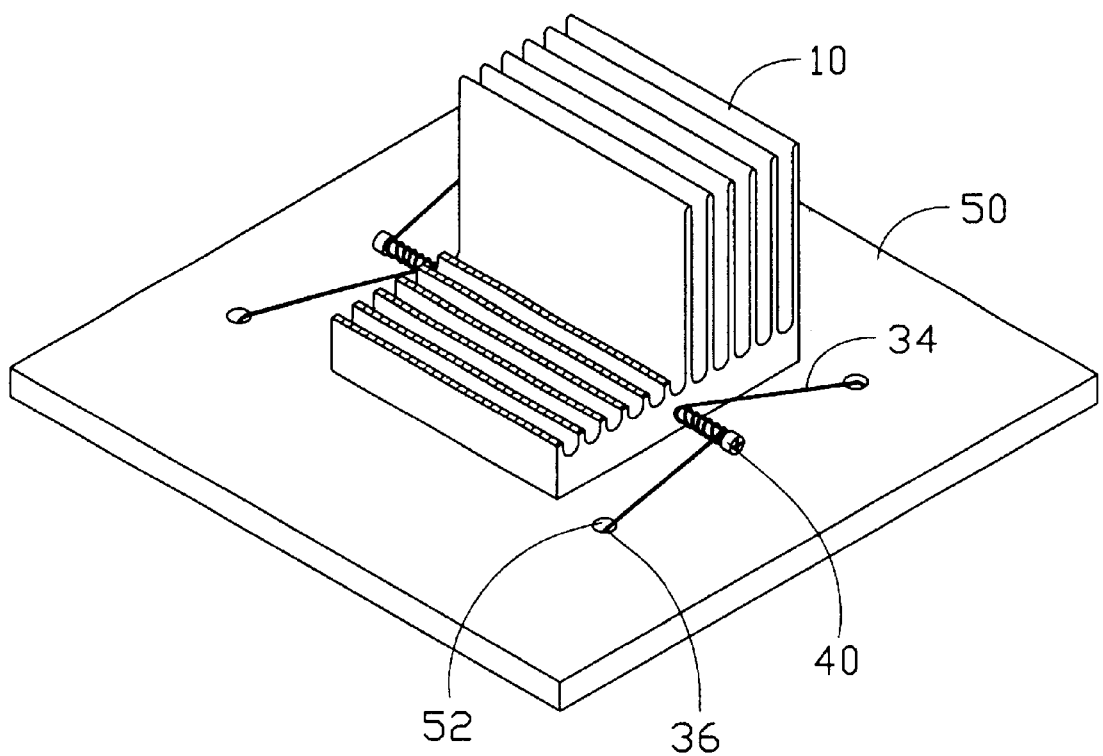
FIG. 3 is a fully assembled view of FIG. 1.

Referring also to FIG. 3, the heat sink 10 is placed on a top surface of the CPU 60. The spring arms 34 of each wire clip 30 are pressed downwardly and outwardly away from each other. The hooks 36 of the wire clip 30 are engagably extended into two corresponding through holes 52 of the motherboard 50. The wire clips 30 thereby resiliently cause the bolts 40 to firmly press the heat sink 10 onto the top surface of the CPU 60.

The heat sink clip assembly uses bolts 40 to fasten the wire clips 30 to opposite sides of the heat sink 10. There are no parts required between the fins 14 of the heat sink 10. Thus there is no limitation on the density of the fins 14. In addition, the heat sink clip assembly uses simple bolts 40 rather than other more complicated components such as pressing shafts. This reduces costs. Furthermore, the wire clips 30 of the heat sink clip assembly are separate parts. They can be readily removed from the bolts 40 by unscrewing the bolts 40 from the base 12. Thus a composition of the wire, a cross-sectional diameter of the wire, a diameter of the coiled portion 32, and an amount and concentration of coiling of the coiled portion 32 can be selected and configured to meet the pressing force requirements of any particular application.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A heat sink clip assembly for attaching a heat sink to an electronic device that is mounted to a motherboard, the heat sink clip assembly comprising:

a pair of bolts threadedly engage in opposite sides of the heat sink; and a pair of wire clips, each of the clips comprising a coiled portion retained over a corresponding bolt, and two spring arms extending from opposite ends of the coiled portion to engage with the motherboard.

2. The heat sink clip assembly as described in claim 1, wherein each of the clips is integrally made from a single piece of spring steel wire.

3. The heat sink clip assembly as described in claim 1, wherein each of the clips provides an amount of pressing force according to a composition of the wire, a cross-sectional diameter of the wire, a diameter of the coiled portion, and an amount and concentration of coiling of the coiled portion.

4. The heat sink clip assembly as described in claim 1, wherein each of the spring arms of each of the clips extends generally perpendicularly relative to a central axis of the coiled portion.

5. The heat sink clip assembly as described in claim 1, wherein a hook is formed at a distal end of each of the spring arms, for engaging with the motherboard.

6. The heat sink clip assembly in accordance with claim 1, wherein the bolts each have a threaded end adapted to threadedly engage in a corresponding one of the opposite sides of the heat sink, a head and a pole between the head and the threaded end, the coiled portions of the clips being retained over the poles of the bolts, the heads of the bolts having a diameter larger than that of the poles.

7. A heat dissipating assembly comprising:

a motherboard;

an electronic device mounted on the motherboard;

a heat sink attached on the electronic device, a pair of screw holes being defined in opposite sides of the heat sink; and a clip assembly comprising a pair of bolts respectively threadedly engaged in the screw holes of the heat sink, and a pair of wire clips respectively retained over the bolts, the wire clips having engaging means for engaging with the motherboard and thereby resiliently attaching the heat sink on the electronic device.

8. The heat dissipating assembly as described in claim 7, wherein each of the wire clips is integrally made of a single piece of spring steel wire, has a coiled portion retained over a corresponding bolt, and further has two spring arms extending from opposite ends of the coiled portion, the engaging means being formed on the spring arms.

9. The heat dissipating assembly as described in claim 8, wherein four through holes are defined in the motherboard around the electronic device, the engaging means comprising a hook formed at a distal end of each of the spring arms, each of the hooks being engaged in a corresponding through hole.

10. A method for dissipating heat from an electronic device on a printed circuit board which defines a plurality of holes near the electronic device, the method comprising the steps of:

providing a heat sink defining a pair of screw holes in opposite sides thereof;

providing a pair of bolts each having a pole, a head and a threaded end;

providing a pair of wire clips each having a coiled portion and two spring arms extending from opposite ends of the coiled portion;

placing the coiled portions of the wire clips over the poles of the bolts;

screwing the threaded ends of the bolts into the screw holes of the heat sink;

placing the heat sink on the electronic device and resiliently moving the spring arms of the wire clips to securely engage in the holes of the printed circuit board, whereby the bolts exert pressing force on the heat sink and make the heat sink intimately contact the electronic device.

* * * * *